US009250714B2

(12) United States Patent
Hiromi et al.

(10) Patent No.: US 9,250,714 B2
(45) Date of Patent: Feb. 2, 2016

(54) OPTICAL PROXIMITY DETECTORS

(71) Applicant: Intersil Americas LLC, Milpitas, CA (US)

(72) Inventors: Itaru Hiromi, Sunnyvale, CA (US); Philip V. Golden, Cambridgeshire (GB); David W. Ritter, San Jose, CA (US); Pradeep Bhardwaj, Livermore, CA (US); Steven Herbst, Berkeley, CA (US); Warren Craddock, Alameda, CA (US)

(73) Assignee: INTERSIL AMERICAS LLC, Milpitas, CA (US)

(*) Notice: Subject to any disclaimer, the term of this patent is extended or adjusted under 35 U.S.C. 154(b) by 0 days.

(21) Appl. No.: 14/495,688

(22) Filed: Sep. 24, 2014

(65) Prior Publication Data

US 2015/0145764 A1    May 28, 2015

Related U.S. Application Data

(60) Provisional application No. 61/909,734, filed on Nov. 27, 2013, provisional application No. 61/940,112, filed on Feb. 14, 2014, provisional application No. 62/042,661, filed on Aug. 27, 2014.

(51) Int. Cl.
*G06F 3/03* (2006.01)
*G01S 17/02* (2006.01)
(Continued)

(52) U.S. Cl.
CPC .............. *G06F 3/0304* (2013.01); *G01S 7/4913* (2013.01); *G01S 7/4915* (2013.01);
(Continued)

(58) Field of Classification Search
CPC ..... G06F 3/0304; G01S 7/481; G01S 7/4913; G01S 17/026; G01S 17/36; H03K 17/941
See application file for complete search history.

(56) References Cited

U.S. PATENT DOCUMENTS 8,274,037 B2     9/2012  Ritter et al.
8,310,655 B2 *  11/2012  Mimeault ............... G01S 7/487
                                                   356/4.01
(Continued)

OTHER PUBLICATIONS

Gokturk et al., "A Time-Of-Flight Depth Sensor—System Description, Issues and Solutions", Proceedings of the 2004 IEEE Computer Society Conference on Computer Vision and Pattern Recognition Workshops (CVPRW'04) 1063-6919/04 , Jun. 2004.
(Continued)

*Primary Examiner* — Kevin M Nguyen
(74) *Attorney, Agent, or Firm* — Vierra Magen Marcus LLP

(57) ABSTRACT

Described herein are optical proximity detectors, methods for use therewith, and systems including an optical proximity detector. Such optical proximity detectors include an analog front-end and a digital back-end. In certain embodiments, the digital back-end includes a dynamic gain and phase offset corrector, a cross-talk corrector, a phase and magnitude calculator, and a static phase offset corrector. The dynamic gain and phase offset corrector corrects for dynamic variations in gain and phase offset of the analog front-end due to changes in temperature and/or operating voltage levels. The crosstalk corrector corrects for electrical and/or optical crosstalk associated with the analog front-end. The phase and magnitude calculator calculates phase and magnitude values in dependence on the corrected versions of digital in-phase and quadrature-phase signals received from the analog front-end. The static phase offset corrector corrects for a static phase offset of the optical proximity detector.

23 Claims, 9 Drawing Sheets

(51) Int. Cl.
  H03K 17/94    (2006.01)
  G01S 17/36    (2006.01)
  G01S 7/491    (2006.01)
(52) U.S. Cl.
  CPC .............. *G01S 17/026* (2013.01); *G01S 17/36* (2013.01); *H03K 17/941* (2013.01); *H03K 2217/94108* (2013.01); *H03K 2217/94116* (2013.01)

(56) References Cited

U.S. PATENT DOCUMENTS

| | | | | |
|---|---|---|---|---|
| 8,384,031 | B2* | 2/2013 | Rueger | G01S 3/7803 250/338.1 |
| 8,610,043 | B2 | 12/2013 | Baxter | |
| 2004/0056199 | A1* | 3/2004 | O'Connor | G01S 7/487 250/341.1 |
| 2014/0152974 | A1 | 6/2014 | Ko | |
| 2014/0191114 | A1 | 7/2014 | Russo et al. | |
| 2014/0213323 | A1* | 7/2014 | Holenarsipur | G06F 3/044 455/566 |

OTHER PUBLICATIONS

Perenzoni et al., "Figures of Merit for Indirect Time-of-Flight 3D Cameras: Definition and Experimental Evaluation", Remote Sensing 2011, 3, pp. 2461-2472, Nov. 2011.

Sabah et al., "Design and Calibration of IQ-Mixers", Design and Calibration of IQ-mixers,Jun. 1998, Prepared for Conference: C98-06-22, p. 1589-1591.

Nash et al., "Correcting Imperfections in IQ Modulators to Improve RF Signal Fidelity", Analog Devices, AN-1039 Application Note, 2009.

Hu et al., "FPGA-Based Digital Phase-Locked Loop Analysis and Implementation", Master Thesis, University of Illinois, 2011.

STMicroelectronics, "STMicroelectronics Proximity Sensor Solves Smartphone Hang-ups", Press Release, Geneva, Feb. 25, 2013, http://www.st.com/web/en/press/p3397.

Nejad, et al., "Comparison of TOF, FMCW and Phase-Shift Laser Range-Finding Methods by Simulation and Measurement", Quartarly Journal of Technology & Education, vol. 1, No. 1, Sep. 2006.

* cited by examiner

OPTICAL PROXIMITY DETECTORS

PRIORITY CLAIM

This application claims priority under 35 U.S.C. 119(e) to U.S. Provisional Patent Application No. 62/042,661, filed Aug. 27, 2014, U.S. Provisional Patent Application No. 61/940,112, filed Feb. 14, 2014, and U.S. Provisional Patent Application No. 61/909,743, filed Nov. 27, 2013, each of which is incorporated by reference herein.

BACKGROUND

Optical proximity detectors (which can also be referred to as optical proximity sensors or optical proximity detection sensors) typically include or use a light source and an adjacent photosensitive light detector. Such optical proximity detectors can be used to detect the presence of an object, estimate proximity of (e.g., distance to) an object and/or detect motion of an object, based on the light originating from the light source that is reflected from an object and detected by the light detector. Where such detectors are specifically used to detect distance to an object, they can also be referred to as optical distance detectors or optical distance sensors. Where such detectors rely on time-of-flight (TOF) principles to detect distance to an object, they can be referred to as optical TOF sensors, optical TOF proximity sensors, optical TOF proximity detectors, or the like. The value of these detectors/sensors has become more important with the advent of battery-operated handheld devices, such as mobile phones. For example, a fair amount of the energy from a mobile phone battery is used to drive the display, and there is value in turning off the display or backlight when the mobile phone or other device is brought to the user's ear (where it cannot be viewed anyway). Optical proximity detectors have been used for this, and many other applications.

For other examples, there are many other applications in which the presence of an object can be detected with an optical proximity detector to advantage. These range from sensing when protective covers have been opened on machinery, paper has been positioned correctly in a printer, or an operator's hands are at risk near an operating machine. An optical proximity detector can also be used as a simple touch or near-touch activated switch, and could be implemented in applications like keyboards or devices that have a plastic housing that is sealed but which allows the light from the source to pass through and be sensed by the detector on the return.

DETAILED DESCRIPTION

Embodiments of the present invention described herein are directed to optical proximity detectors, methods for use therewith, and systems including an optical proximity detector. Such optical proximity detectors include an analog front-end and a digital back-end. In accordance with certain embodiments, the digital back-end includes a dynamic gain and phase offset corrector, a cross-talk corrector, a phase and magnitude calculator, and a static phase offset corrector. The dynamic gain and phase offset corrector corrects for dynamic variations in gain and phase offset of the analog front-end due to changes in temperature and/or operating voltage levels. The cross-talk corrector corrects for electrical and/or optical crosstalk associated with the analog front-end. The phase and magnitude calculator calculates phase and magnitude values in dependence on the corrected versions of digital in-phase and quadrature-phase signals received from the analog front-end. The static phase offset corrector corrects for a static phase offset of the optical proximity detector.

Figure 1:
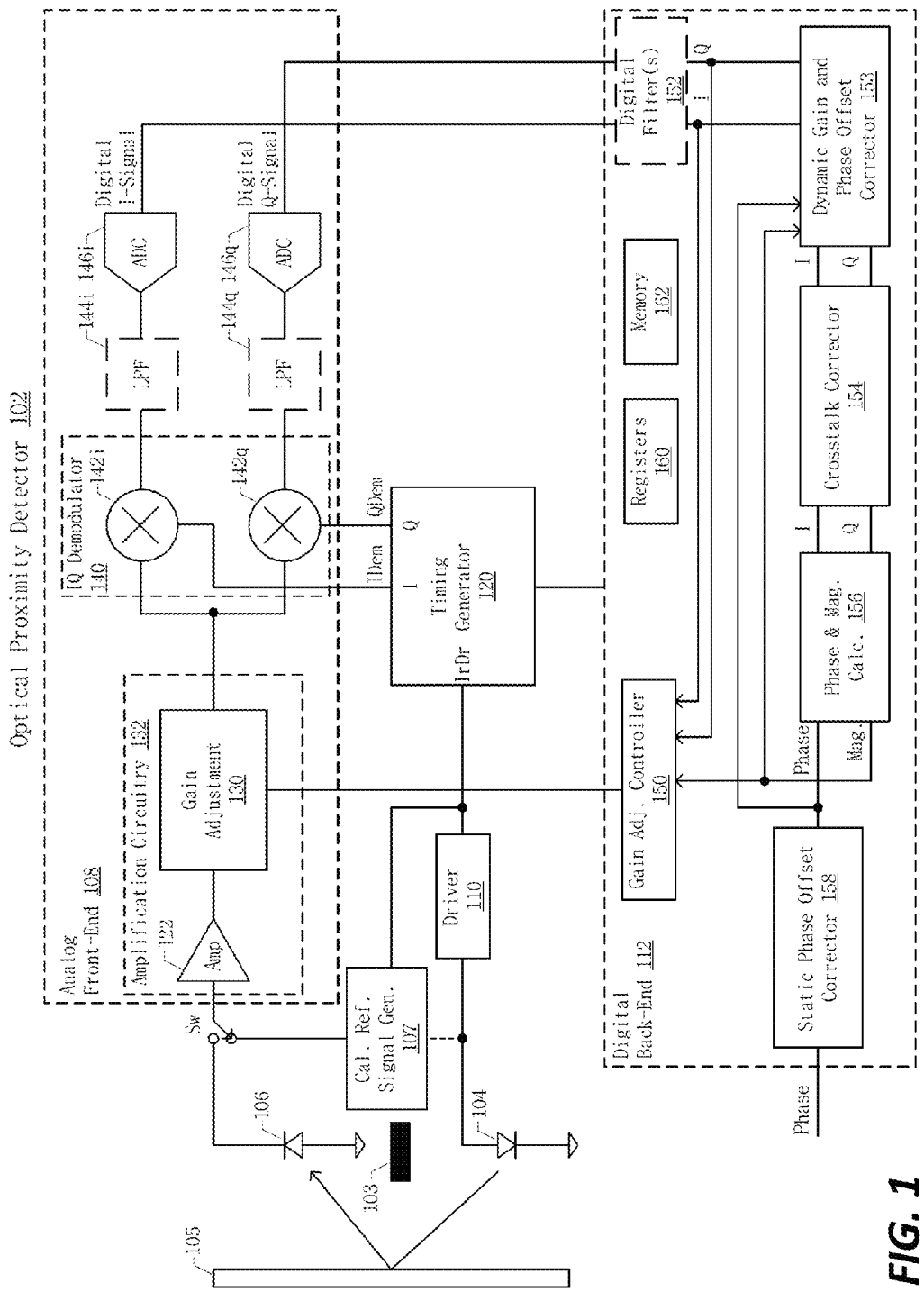
FIG. 1 illustrates an optical proximity detector according to an embodiment of the present invention.

FIG. 1 illustrates an optical proximity detector 102 according to an embodiment of the present invention. Where the optical proximity detector 102 is used for detecting a distance to an object (e.g., 105), the optical proximity detector 102 can alternatively be referred to as an optical distance detector 102. Where the optical proximity detector 102 relies on time-of-flight (TOF) principles to detect distance to an object, it can also be referred to more specifically as an optical TOF distance sensor, an optical TOF proximity sensor, an optical TOF proximity detector, or the like. Referring to FIG. 1, the optical proximity detector 102 is shown as including an infrared light source 104, a light detector 106, analog front-end circuitry 108, digital back-end circuitry 112, a driver 110 and a timing generator 120. The light source 104 and the light detector 106 can also be considered part of the analog front-end circuitry 108. The analog front-end circuitry 108 can also be referred to as an analog front-end, a front-end channel, or simply a front-end. Similarly, the digital back-end circuitry 108 can also be referred to as a digital back-end, a back-end channel, or simply a back-end. The timing generator 120 can include, e.g., a local oscillator that outputs a high frequency signal (e.g., 5 MHz), and a phase shifter that shifts the phase of the high frequency signal by 90 degrees. As will be described in additional detail below, the high frequency signal (e.g., 5 MHz) may be provided to the driver 110 and the front-end 108, and the high frequency signal shifted by 90 degrees may also be provided to the front-end 108. The timing generator 120 can also include circuitry to produce signals of other frequencies, e.g., lower and/or higher frequencies, which may be used by various other blocks of the optical proximity detector 102.

The infrared light source 104 can be, e.g., one or more infrared light emitting diode (LED) or infrared laser diode, but is not limited thereto. While infrared (IR) light sources are often employed in optical proximity detectors, because the human eye cannot detect IR light, the light source can alternatively produce light of other wavelengths. Accordingly, the infrared light source 104 can be referred to more generically as the light source 104. The light detector 106 can be, e.g., one or more photodiodes (PD), but is not limited thereto. When implemented as a PD operating in a photoconductive mode, the light detector 106 coverts detected light into a current signal. If implemented as a PD operating in photovoltaic mode, the light detector 106 would convert detected light into a voltage signal. Unless stated otherwise, it will be assumed for the sake of this description that the light detector 106 is a PD operating in the photoconductive mode.

In accordance with an embodiment, the front-end 108 receives a wide range of input currents (from the light detector 106) at a high frequency (e.g., 5 MHz), and conditions the signal for digitizing. Such conditioning can include adjusting gain to increase and preferably optimize dynamic range, filtering to increase and preferably optimize signal-to-noise ratio (SNR), and IQ demodulating to simplify digital back-end processing. In accordance with an embodiment, the digital back-end 112 performs additional filtering, corrects for dynamic gain and phase offset errors, corrects for crosstalk errors, and calculates a phase that is indicative of a distance between the optical proximity detector 102 and a target 105. The digital back-end 112 can also correct for static phase offset errors. Additionally, the digital back-end 112 generates one or more control signals for the analog front-end 108. Additional details of the analog front-end 108 and the digital back-end 112 are described below.

Still referring to FIG. 1, in accordance with an embodiment, the analog front-end 108 includes an amplifier 122, a gain adjustment circuit 130, an IQ demodulator circuit 140, analog low pass filters 144i, 144q and analog-to-digital converters (ADCs) 146i, 146q. While ADCs 146i and 146q are illustrated as two separate ADCs, a single ADC can instead be used, where the single ADC is time shared between the I and Q channels. In accordance with an embodiment, the digital back-end 112 includes a gain adjustment controller 150, one or more digital filter(s) 152, a dynamic gain and phase offset corrector 153, a crosstalk corrector 154, a phase and magnitude calculator 156 and a static phase offset corrector 158. In accordance with an embodiment, each of the blocks within the digital back-end 112 are implemented using a digital signal processor (DSP). Alternatively, each of the blocks within the digital back-end 112 can be implemented using digital circuitry. It is also possible that some of the blocks of the digital back-end 112 can be implemented using a DSP, while other blocks are implemented using digital circuitry.

The driver circuit 110 produces a drive signal in dependence on a drive timing signal (also referred to as the IrDr timing signal) produced by the timing generator 120. The drive timing signal can be, e.g., a 5 MHz square wave signal, but is not limited thereto. This drive signal is used to drive the infrared light source 104, in response to which the infrared light source 104 emits infrared light. The modulation frequency of the emitted infrared light, which can also be referred to as the carrier frequency, is dependent on the frequency of the drive timing signal (e.g., 5 MHz). In other words, where the infrared light source 104 is driven by a 5 MHz drive signal, then the carrier frequency of the emitted infrared light will be 5 MHz.

If there is a target 105 (which can more generally be referred to as an object 105) within the sense region (i.e., field of view and range) of the optical proximity detector 102, infrared light emitted by the infrared light source 104 will be reflected from the target 105, and a portion of the reflected infrared light will be incident on the light detector 106. In response to detecting light, the light detector 106 produces a light detection signal that is indicative of the magnitude and the phase of the detected light. The magnitude of the light detection signal can be dependent, e.g., on the distance between the target 105 and the optical proximity detector 102 and the color of the target. In general, all other things being equal, the closer the target 105, the greater the magnitude of the light detection signal. Further, all other things being equal, if a target has a white color, or another highly reflective color, the magnitude of the light detection signal will be greater than if the target has a black color, or another lowly reflective color. By contrast, the phase of the light detection signal should be primarily dependent on the distance between the target 105 and the optical proximity detector 102, and should not depend on the color or reflectivity of the target 105.

While not shown in FIG. 1, one or more optical filter can be located in front of the light detector 106 to reflect and/or absorb wavelengths that are not of interest. For a more specific example, one or more optical filters can be used to reject ambient visible light and pass infrared light. Alternative and/or additional techniques for rejecting and/or compensating for ambient visible light can be used, as are known in the art.

Infrared light emitted by the light source 104 and detected by the light detector 106, which has not been reflected off of the target object 105, is considered optical crosstalk that reduces the capability of the overall device or system to sense distance. Some such light may travel directly from the light source 104 to the light detector. To reduce and preferably prevent light from traveling directly from the light source 104 to the light detector 106, an opaque light barrier (shown as element 103 in FIG. 1) can be used to isolate the light source 104 from the light detector 106. However, light barriers are often imperfect, resulting in light leaking under, over and/or through the barrier. Additionally, optical crosstalk may result from specular reflections and/or other types of backscatter, especially where the light source 104 and the light detector 106 are covered by a glass or plastic cover plate, as is known in the art.

The light detection signal produced by the light detector 106 can be amplified by an optional amplifier 122 (which has a fixed gain) before the light detection signal is provided to a gain adjustment circuit 130. The optional amplifier 122 can also be used to convert a current signal to a voltage signal, or vice versa, depending upon whether there is a desire to perform signal processing in the voltage or current domain, and depending upon whether the light detector 106 produces a voltage signal or a current signal indicative of the magnitude and phase of detected light. For example, the amplifier 122 can be a transimpedance amplifier (TIA) having a fixed gain. Most signals described herein are referred to generically as a signal, without specifying whether the signal is a current signal or a voltage signal. This is because either type of signal can be used, depending upon implementation. Unless stated otherwise, it will be assumed that the amplifier 122 is a transimpedance amplifier (TIA) that converts a current signal produced by the light detector 106 to a voltage signal, and that further processing by the front-end 108 is done in the voltage domain, as opposed to the current domain. The amplifier 122 and the gain adjustment circuit 130 collectively, or individually, can be referred to as amplification circuitry 132, or more specifically, as analog amplification circuitry 132.

Still referring to FIG. 1, the gain adjustment circuit 130 includes at least one variable gain amplifier (VGA) that is controlled by the Gain adjustment controller 150. Within this document, the light detection signal, as the term is used herein, is a signal indicative of the magnitude and the phase of the light detected by the light detector 106, whether or not the signal is amplified by the optional fixed gain amplifier 122. The gain adjustment circuit 130 adjusts the amplitude of light detection signal in dependence on one or more gain adjustment signal received from the Gain adjustment controller 150, as will be described in additional detail below. The output of the gain adjustment circuit 130, which can be referred to as the amplitude adjusted light detection signal, is provided to the IQ demodulator 140. More generally, the output of the analog amplification circuitry 132 can be referred to as the amplitude adjusted light detection signal.

The gain adjustment circuit 130 can also include, for example, a band-pass filter (BPF), which reduces the bandwidth of the front-end 108 to reject noise that would otherwise adversely affect the front-end 108. The BPF can, for example, have a center frequency of 5 MHz, a 3 dB 500 kHz bandwidth, a lower cutoff frequency of 4.75 MHz and an upper cutoff frequency of 5.25 MHz. The BPF can be between a pair of VGAs of the gain adjustment circuit 130. This is just an example, which is not meant to be limiting.

The IQ demodulator 140 separates the amplitude adjusted light detection signal into an in-phase signal and a quadrature-phase signal (which can also be referred to respectively as an I-component and a Q-component, or as simply as an I-signal and a Q-signal), wherein the quadrature-phase signal is 90 degrees out of phase relative to the in-phase signal. In an embodiment, the IQ demodulator 140 includes a pair of mixers, labeled 142i and 142q, which can also be referred to as multipliers 142i and 142q. Both of the mixers 142i, 142q receive the same amplitude adjusted light detection signal from the gain adjustment circuit 130. The mixer 142i multiplies the amplitude adjusted light detection signal by an in-phase demodulation signal (IDem) produced by the timing generator 120. The mixer 142q multiplies the amplitude adjusted light detection signal by a quadrature-phase demodulation signal (QDem) produced by the timing generator 120.

In accordance with an embodiment, the in-phase demodulation signal (IDem) has the same phase as (i.e., is in phase with) the drive timing signal (also referred to as the IrDr timing signal) produced by the timing generator 120, which is used to generate the drive signal that drives the light source 104; and the quadrature-phase demodulation signal (QDem) is 90 degrees out of phase from the in-phase demodulation signal (IDem) (and thus, is 90 degrees out of phase from the drive timing signal produced by the timing generator 120). While separating the amplitude adjusted light detection signal into in-phase and quadrature-phase signals, the mixers 142i, 142q also down convert these signals to baseband.

In an embodiment, the in-phase signal and the quadrature-phase signal (both of which are output by the IQ demodulator 140) are low pass filtered by respective optional analog LPFs 144i, 144q and digitized by respective ADCs 146i, 146q. The optional analog LPFs 144i, 144q can be used to filter out harmonics and high frequency noise that are not of interest, which result from the mixing performed by the mixers 142i, 142q. The output of the ADC 146i can be referred to as a digital in-phase signal, and the output of the ADC 146q can be referred to as a digital quadrature-phase signal.

The digital in-phase signal and the digital quadrature-phase signal output by the front-end 108, which can be referred to respectively as the digital I-signal and the digital Q-signal, are provided to the digital back-end 112. As mentioned above, the digital back-end 112 is shown as including one or more optional digital filter(s) 152, a dynamic gain and phase offset corrector 153, a crosstalk corrector 154, a phase and magnitude calculator 156, a static phase offset corrector 158, and a gain adjustment controller 150.

Each of the digital filter(s) 152 can, for example, be implemented as an integrate-and-dump circuit, in which case it can also be referred to as a decimator, an integrate-and-dump decimator, or an integrate-and-dump filter. For example, one digital filter 152 can integrate the digital in-phase signal for a period of time and then output (a.k.a. dump) the result, at which point it is reset and repeats the integration and dump functions for another period of time, and so on; and another digital filter 152 can integrate the digital quadrature-phase signal for a period of time and then output (a.k.a. dump) the result, at which point it is reset and repeats the integration and dump functions for another period of time, and so on. Other implementations of the digital filter(s) 152 are also possible.

In accordance with an embodiment, the gain adjustment controller 150 determines or approximates the amplitude of the IQ vector provided to it to thereby adjust the gain of the VGA(s) of the front-end 108 so that the amplitude of the IQ vector is substantially equal to a target amplitude, in order to increase and preferably optimize the dynamic range of the front-end 108. If the amplitude of the IQ vector is below the target amplitude, then the gain(s) of the VGA(s) within the gain adjustment circuit 130 are increased. Conversely, if the amplitude of the IQ vector is above the target amplitude, then the gain(s) of the VGA(s) within the gain adjustment circuit 130 are decreased. In other words, a gain adjustment feedback loop is used to adjust the amplitude of the IQ vector. The gain adjustment controller 150 can determine the amplitude of the IQ vector, e.g., by calculating the square root of the sum of the amplitude of digital I-signal squared and the amplitude of the digital Q-signal squared. Alternatively, the gain adjustment controller 150 can approximate the amplitude of the IQ vector by simply assuming that the amplitude of the IQ vector is equal to the greater of the amplitude of the digital I-signal and the amplitude of the digital Q-signal. In other words, the gain adjustment controller 150 can compare the amplitude of the digital I-signal to the amplitude of the digital Q-signal, and select which ever amplitude is greater as an approximation of the amplitude of the IQ vector. The gain adjustment controller 150 can alternatively use other techniques to determine or approximate the amplitude of the IQ vector. Alternatively, peak detectors can be used to monitor the swing of the amplitude adjusted light detection signal, and the gain adjustment controller 150 can adjust the gain to adjust the swing to a specified level.

The dynamic gain and phase offset corrector 153 corrects for dynamic variations in gain and phase offset of the analog front-end 108 that are due to changes in temperature and/or operating voltage levels of the analog front-end 108. Such changes in operating voltage levels can, e.g., be due to changes in voltage levels used to power components of the analog front-end 108. The crosstalk corrector 154 corrects for electrical crosstalk and/or optical crosstalk, depending upon implementation. The phase and magnitude calculator 156 calculates phase and magnitude values in dependence on the digital I-signal and the digital Q-signal received from the analog front-end 108, and more specifically, based on corrected versions thereof. The corrected versions of the digital I-signal and the digital Q-signal that are received by the phase and magnitude calculator 156 can also be referred to as the corrected IQ vector. Various well known algorithms, such as but not limited to a CORDIC algorithm, can be used to calculate the phase from the corrected IQ vector. The static phase offset corrector 158 corrects for a static phase offset of the optical proximity detector 102, which can also be referred to as distance offset calibration. The phase value output from the static phase offset corrector 158 can be stored in a register (e.g., 160) or memory (e.g., 162) within the digital back-end 112, or external to the digital back-end. Either way, such a register or memory can be accesses by another subsystem that is responsive to the phase, or more generally, to the distance between the target 105 and the optical proximity detector 102. It is also possible that the subsystem that accesses the stored phase simply responds to the presence of a target 105 within the range and field of view of the optical proximity detector 102.

Additionally details of the operation of the dynamic gain and phase offset corrector 153, the crosstalk corrector 154 and the static phase offset corrector 158, are discussed below. A benefit of the back-end 112 described with reference to FIG. 1 performing corrections and calculations in IQ domain, is that the IQ domain is linear and can be approximated by a linear function. This advantageously allows linear processing techniques to be used, which can significant ease implementation complexity.

In FIG. 1 (and FIGS. 3A and 3B described below), the IQ Demodulator 140 is shown as being part of the analog front-end 108 and performing IQ demodulation in the analog domain upstream from the ADCs 146i, 146q. In alternative embodiments, the IQ Demodulator can be part of the digital back-end 112 and can perform IQ demodulation in the digital domain. More specifically, the amplitude adjusted light detection signal, which is output by the amplification circuitry 132, can be converted to a digital amplitude adjusted light detection signal by an ADC 146 of the analog front-end 108. The digital back-end 112 can then separate the digital amplitude adjusted light detection signal into digital in-phase and quadrature-phase versions thereof (which can also be referred to respectively as an I-component and a Q-component, or as simply as an I-signal and a Q-signal), wherein the digital quadrature-phase signal is 90 degrees out of phase relative to the digital in-phase signal. In other words, instead of performing the IQ demodulation between the amplification circuitry 132 and the ADCs 146, the IQ demodulation can alternatively be performed between an ADC 146 (e.g., implemented as a bandpass sigma delta ADC, but not limited thereto) and the dynamic gain and phase offset corrector 153. The dynamic gain and phase offset corrector 153, the crosstalk corrector 154, and the static phase offset corrector 158, described below, can be used with either of the above described embodiments, i.e., regardless of whether an IQ demodulator is part of the analog front-end or the digital back-end.

Dynamic Analog Gain and Phase Offset Correction

While not specifically shown in FIG. 1, there are voltage regulators and/or other analog voltage supplies that provide power to analog components of the analog front-end 108, such as, but not limited to, the amplifier 122 and the one or more VGAs of the gain adjustment circuit 130. The operation of such analog components may vary depending upon the temperature of such components and/or the supply voltage provided to such components. More specifically, the gain of such analog components may vary (e.g., drift) depending upon the temperature of such components and/or the operating voltage of such components. Additionally, a phase offset caused by such components may vary depending upon the temperature of such components and/or the operating voltage of such components. If not dynamically compensated for, these dynamic changes in gain and phase offset may adversely affect phase calculations that are used to determine the distance of an object (e.g., 105) relative to the optical proximity detector 102. Specific embodiments of the present invention, which will now be described, are used to compensate for such dynamic changes in gain and phase offsets of analog components of the analog front-end 108.

The dynamic response of the amplifier 122 and the gain adjustment circuit 130 of the analog front-end 108 (and more generally, the analog circuitry of the analog front-end prior to the IQ demodulator) can be mathematically represented by the following equation:

$$H(s) = H_O(s) \cdot A(V,T) \cdot e^{j\phi(V,T)}$$

where

H(s) represents the overall response of the amplifier and the gain adjustment circuit of the analog front-end, $H_O(s)$ represents the nominal response of the amplifier and the gain adjustment circuit of the analog front-end, A(V,T) represents dynamic gain offset of the amplifier and the gain adjustment circuit of the analog front-end as a function of operating voltage and temperature, and $\phi(V,T)$ represents dynamic phase offset of the amplifier and the gain adjustment circuit of the analog front-end as a function of operating voltage and temperature.

In accordance with an embodiment, in order to compensate for the dynamic gain and phase offsets of the analog circuitry of the analog front-end 108 prior to the IQ demodulator, the dynamic gain and phase offset corrector 153 has a transfer function substantially equal to $H_O(s)/H(s) = 1/\{A(V,T) \cdot e^{j\phi(V,T)}\}$. In other words, the dynamic gain and phase offset corrector 153 has a transfer function that is substantially equal to the inverse of the dynamic portion of the transfer function of the amplifier 122 and the gain adjustment circuit 130 of the analog front-end 108 (and more generally, the dynamic portion of the analog circuitry of the analog front-end prior to the IQ demodulator). If the transfer function of the dynamic gain and phase offset corrector 153 is $H_O/H'(s)$, then the desire is for H'(s) to be as close as possible to H(s). More generally, the dynamic analog gain and phase offset corrector 153 corrects for dynamic variations in gain and phase offset of the analog front-end 108 that are due to changes in temperature and/or supply voltage levels used to power components of the analog front-end 108.

In accordance with an embodiment, in order to estimate the response of the amplifier 122 and the gain adjustment circuit 130 of the analog front-end 108 (and more generally, the analog circuitry of the analog front-end prior to the IQ demodulator), a calibration reference signal is generated by a calibration reference signal generator 107 and provided to the analog front-end 108 using a switch Sw during a calibration mode, which can more specifically be referred to as a dynamic gain and phase offset calibration mode or procedure. More specifically, the switch Sw connects an input of the analog front-end 108 to an output of the calibration reference signal generator 107 during the dynamic gain and phase offset calibration mode, and the switch Sw connects the input of the analog front-end 108 to the light detector 106 during an operational mode.

In accordance with certain embodiments, the calibration reference signal generated by the calibration reference signal generator 107 is essentially an attenuated version of the drive signal output by the driver 110 that is matched in phase with the drive signal output by the driver 110. In one embodiment, the calibration reference signal receives the same signal provided to an input of the driver 110 (i.e., the IrDr timing signal) and generates an output that is matched in phase to the output of the driver 110, but has a magnitude that is within the dynamic range of the analog front-end 108. In another embodiment, the calibration reference generator 107 includes a further light source and light detector (distinct from 104 and 106) that are configured as an optical coupler, wherein a signal produced by the further light detector (of the optical coupler) is the calibration reference signal. In still another embodiment, the calibration reference signal generator 107 includes a sense resistor that senses the drive signal output by the driver 110, and an attenuator that attenuates a magnitude of the sensed drive signal without changing a phase of the drive signal. Alternatively, during the calibration mode, the driver 110 can output a drive signal having a reduced magnitude that is used as the calibration reference signal. Regardless of the implementation, a calibration reference signal is generated and provided to the analog front-end 108 using a switch Sw during dynamic gain and phase offset calibration mode, wherein the calibration reference signal has the same phase as the drive signal output by the driver 110 and has a magnitude that is within the dynamic range of the analog front-end 108. Such a calibration reference signal can also be referred to as a zero-phase (ZP) calibration reference signal.

If there were no dynamic gain offset caused by the amplifier 122 and the gain adjustment circuit 130 of the analog front-end 108 (and more generally, by the analog circuitry of the analog front-end prior to the IQ demodulator), then the magnitude of the IQ vector (including the digital I-signal and the digital Q-signal) output by the ADCs 146i, 146q in response to the calibration reference signal being provided to the analog-front end 108 should be solely dependent on the magnitude of the calibration reference signal, a nominal level of gain caused by the amplifier 122, and a nominal level of gain caused by the gain adjustment circuit 130. Accordingly, the expected magnitude of the IQ vector (produced in response to the calibration reference signal being provided to the analog-front end 108) can be readily calculated or otherwise determined by directly computing the Pythagorean theorem or the CORDIC algorithm, but not limited thereto. However, because the actual levels of gain caused by the amplifier 122 and the gain adjustment circuit 130 will vary due to variations in temperature and/or operating voltage, the actual magnitude of the IQ vector (produced in response to the calibration reference signal being provided to the analog-front end 108) will differ from the expected magnitude, with the difference therebetween being the dynamic gain offset caused by the amplifier 122 and the gain adjustment circuit 130 of the analog front-end 108 (and more generally, by the analog circuitry of the analog front-end prior to the IQ demodulator). This difference between the actual magnitude of the IQ vector and the expected magnitude of the IQ vector, which can be determined during calibration mode, will be referred to as the zero-phase gain offset or simply as $A_{ZP}$.

If there were no dynamic phase offset caused by the amplifier 122 and the gain adjustment circuit 130 of the analog front-end 108 (and more generally, by the analog circuitry of the analog front-end prior to the IQ demodulator), then the phase of the IQ vector (including the digital I-signal and the digital Q-signal) output by the ADCs 146i, 146q in response to the calibration reference signal being provided to the analog-front end 108 should be a nominal phase offset. In other words, the expected phase of the IQ vector (produced in response to the calibration reference signal being provided to the analog-front end 108) is a nominal phase. However, because the amplifier 122 and the gain adjustment circuit 130 cause a phase offset that will vary due to variations in temperature and/or operating voltage, the actual phase of the IQ vector (produced in response to the calibration reference signal being provided to the analog-front end 108) will differ from the expected nominal phase offset, with the difference therebetween being the dynamic phase offset caused by the amplifier 122 and the gain adjustment circuit 130 of the analog front-end 108 (and more generally, by the analog circuitry of the analog front-end prior to the IQ demodulator). This difference between the actual phase of the IQ vector and the expected phase of IQ vector, which can be determined during calibration mode, will be referred to as the zero-phase phase offset or simply as $\phi_{ZP}$.

In accordance with an embodiment, the zero-phase gain offset (i.e., $A_{ZP}$) and the zero-phase phase offset (i.e., $\phi_{ZP}$) are determined during the calibration mode, and used to determine the transfer function that is applied by the dynamic gain and phase offset corrector 153 during operational mode. More specifically, in accordance with an embodiment the transfer function of the dynamic gain and phase offset corrector 153 is $$H_O/H'(s) = \frac{1}{A_{ZP}} \cdot e^{-j\phi_{ZP}}.$$

Depending upon implementation, the aforementioned transfer function, which is applied by the dynamic gain and phase offset corrector 153, can also be used to correct for dynamic gain and phase offsets caused by the light source 104 and/or the light detector 106.

Crosstalk Correction

As noted above, the crosstalk corrector 154 corrects for electrical crosstalk and/or optical crosstalk, depending upon implementation. Electrical crosstalk can result, e.g., from a single ended relatively high current in-phase drive signal, produced by driver 110, which is used to drive the light source 104. More generally, electrical crosstalk can also be caused by undesired capacitive, inductive, and/or conductive coupling from one circuit, part of a circuit, or channel, to another, and/or due to undesired power supply coupling. Optical crosstalk can result, e.g., from specular reflections, Lambertian reflections, or leakage through the light barrier 103 that separates the light source 104 and the light detector 106. Exemplary further details of causes and sources of optical crosstalk were discussed above.

Optimally, if the driver 110 drives the infrared light source 104 and there is no target (e.g., 105) within the sense region (i.e. field of view and range) of the optical proximity detector 102, then no infrared light emitted by the infrared light source 104 should be incident on the light detector 106, and no signal should be provided to analog-front end, in which case the digital I-signal and the digital Q-signal should have a zero magnitude. However, due to electrical crosstalk and optical crosstalk, this will not be the case. Embodiments of the present invention correct for such crosstalk, as explained below.

In accordance with an embodiment, crosstalk is determined during a crosstalk calibration procedure or mode, during which the light detector 106 is caused to be non-responsive to light incident on the light detector 106 from outside the optical proximity detector 102, and the light source 104 is driven by the driver 110 in the same manner it would be during the operational mode. The light that the light detector 106 should not be responsive to includes both light that originated from the light source 104 and exited the optical proximity detector 102, as well as ambient light that originated from another source of light. In one embodiment, the switch Sw can be used to disconnect the input of the amplifier 122 from the light detector 106, and instead connect the input of the amplifier 122 to a further light detector (e.g., a dummy or calibration light detector) that is substantially the same as the light detector 106 but is permanently covered with or encased within an opaque material so that no light is ever incident on the further light detector. In this embodiment, the digital I-signal and the digital Q-signal that are output by the ADCs 146 comprise an IQ vector that is indicative of the electrical crosstalk produced by the analog-front end 108, but is not indicative of optical crosstalk.

In another embodiment, the light detector 106 can be caused to be non-responsive to light incident on the light detector 106 from outside the optical proximity detector 102 by temporarily covering the light detector 106 with an opaque material so that no light that is incident on the optical proximity detector 102 will be incident on the light detector 106. In still another embodiment, the light detector 106 can be caused to be non-responsive to light incident on the light detector 106 from outside the optical proximity detector 102104 by temporarily placing the optical proximity detector in a completely dark environment (e.g., a sealed chamber or room) that does not include a target (e.g., 105) within the sense region of the optical proximity detector 102. In these latter two embodiments, the signal produced by the light detector 106 will include both electrical and optical crosstalk. More specifically, in these two latter embodiments the digital I-signal and the digital Q-signal that are output by the ADCs 146 will comprise an IQ vector indicative of the electrical crosstalk produced by the analog-front end 108, which is also indicative of optical crosstalk. Crosstalk error data indicative of this IQ vector is stored, e.g., in one or more registers 160 and/or in memory 162 (preferably in non-volatile memory), for use by the crosstalk corrector 154 during the operational mode of the optical proximity detector 102. More specifically, during the operational mode the IQ vector indicative of crosstalk can be subtracted from the dynamic gain and phase offset corrected IQ vector output by the dynamic gain and phase offset corrector 153 to produce a dynamic phase and offset corrected and crosstalk corrected IQ vector.

The aforementioned crosstalk error data can be stored, e.g., in one or more registers 160 or in memory 162 this is/are accessible to the crosstalk corrector 154. The above described crosstalk calibration procedure can performed just once, e.g., in a factory setting, or from time to time, e.g., periodically and/or in response to a triggering event.

Static Phase Offset Correction

The IQ vector that is output by the crosstalk corrector 154 can be referred to as the dynamic phase and offset corrected and crosstalk corrected IQ vector, or more simply as the corrected IQ vector. The phase and magnitude calculator 156 calculates phase and magnitude values in dependence on this corrected IQ vector, e.g., using a look up table, or a CORDIC algorithm, but not limited thereto. The magnitude value can be used by the gain adjustment controller 150 to adjust the gain provided by the gain adjustment circuit 130. The phase value can be used to calculate a distance between the optical proximity detector 102 and a target 105, which can also be referred to as the distance to the target 105. For example, the phase value, which can also be referred to as the phase-offset (relative to the light emitted by the IR light source), can be converted to a time delay (because for any carrier frequency there is a corresponding relationship between phase-offset and time delay). The time delay can be converted to a roundtrip distance by multiplying the time delay by the well-known speed of light, as is typically done when using time-of-flight (TOF) principles. The roundtrip distance can be converted to a one-way distance, which is the distance between the optical proximity detector 102 and the object 105, by dividing the roundtrip distance by two. More specifically, the distance (d) between the optical proximity detector 102 and the object 105 can be determined using the equation: $d=(c*t)/2$, where c is the speed of light and t is the time delay. Optimally, if a target 105 is positioned at a known distance (e.g. 6 inches) from the optical proximity detector 102, then the phase determined by the phase and magnitude calculator 156 should correspond to the target 105 being that known distance (e.g., 6 inches) from the optical proximity detector 102. However, due to a static phase offset associated with the analog-front end 108, this will not be the case. In other words, it is inherent that the analog circuitry within the front-end 108 will effect that accuracy of the phase determined by the phase and magnitude calculator 156. Embodiments of the present invention correct for such a static phase offset, as explained below.

In accordance with an embodiment, during a static phase offset calibration procedure or mode, a target 105 is placed at a known distance from the optical proximity detector 102, and the phase output by the phase and magnitude calculator 156 is compared to a phase that actually corresponds to the known distance. For example, if the phase that actually corresponds to the known distance is $\phi_1$, but the phase and magnitude calculator 156 determines that the phase is $\phi_2$ when an object 105 is at that known distance, then the static phase offset $\phi_{spo}$ can be determined using the equation $\phi_{spo}=\phi_2-\phi_1$. The static phase offset value error data can be stored, e.g., in one or more registers 160 or in memory 162 this is/are accessible to the static phase offset corrector 158. During operational mode, the static phase offset corrector 158 corrects for a static phase offset of the optical proximity detector 102, which can also be referred to as distance offset calibration. More specifically, during the operational mode the static phase offset corrector 158 subtracts the static phase offset (determined during the static phase offset calibration procedure) from the phase value output by the phase and magnitude calculator 156.

In accordance with certain embodiments, the steps associated with the various calibration modes or procedures are performed prior to the steps associate with the operational mode. For example, the steps associated with the various calibration modes can be performed every time the steps associate with the operational mode are to be performed, or just one out of every N times the steps associate with the operational mode are to be performed, or when the steps associate with the operational mode are to be performed and it's been at least a specified amount of time since the last time the calibration mode was performed. In specific embodiments, the steps associated with the crosstalk calibration mode and the static offset calibration mode are performed once, e.g., in a factory, and the steps associated with the dynamic gain and phase offset calibration mode are performed every time the steps associate with the operational mode are to be performed, or just one out of every N times the steps associate with the operational mode are to be performed, or when the steps associate with the operational mode are to be performed and it's been at least a specified amount of time since the last time the calibration mode was performed. These are just a few examples, which are not intended to be all encompassing.

Methods

Figure 2A:
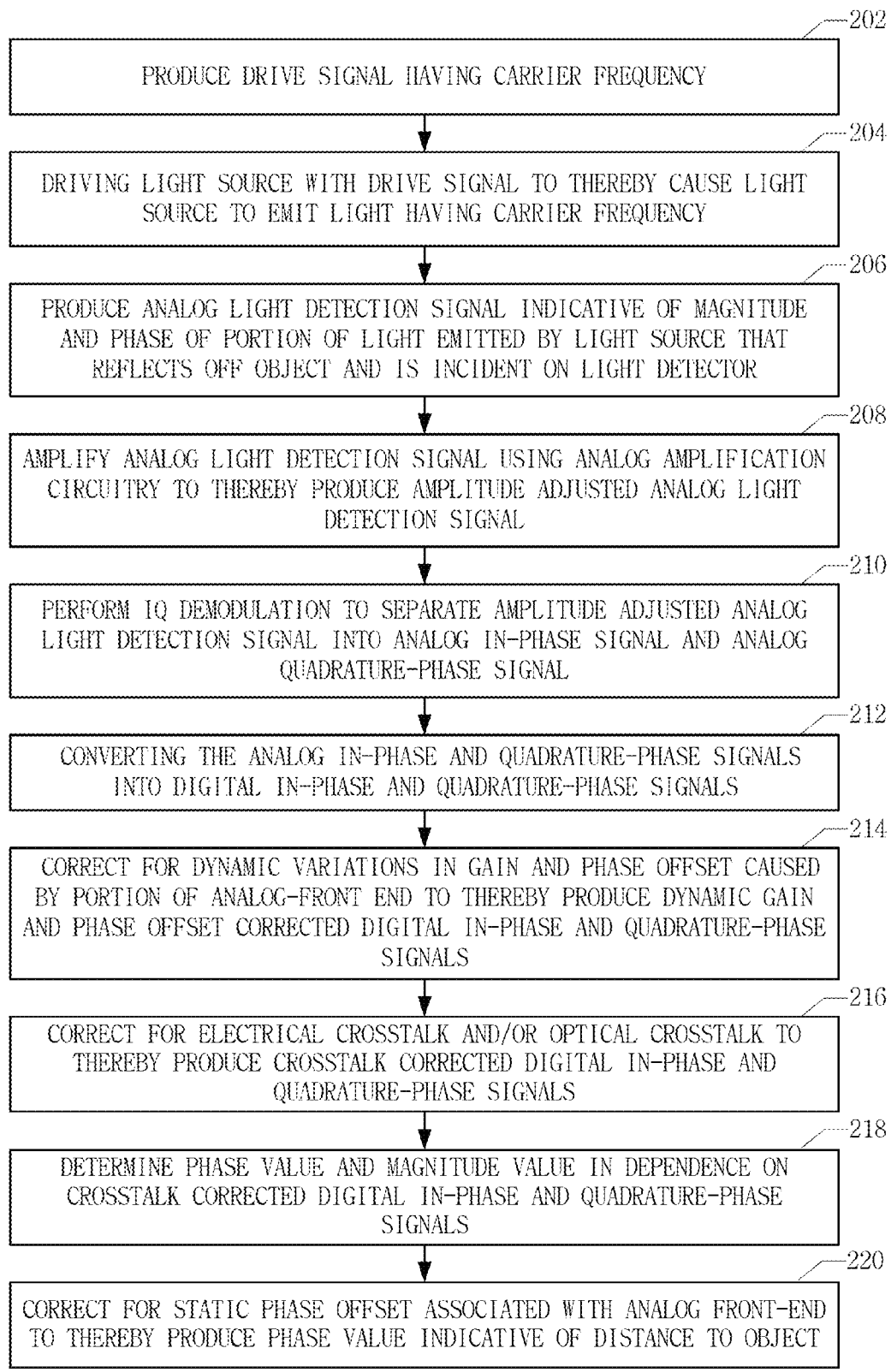
FIG. 2A is a high level flow diagram that is used to describe a method for use by an optical proximity detector, such as the one introduced in FIG. 1, during an operational mode.
Figure 2B:
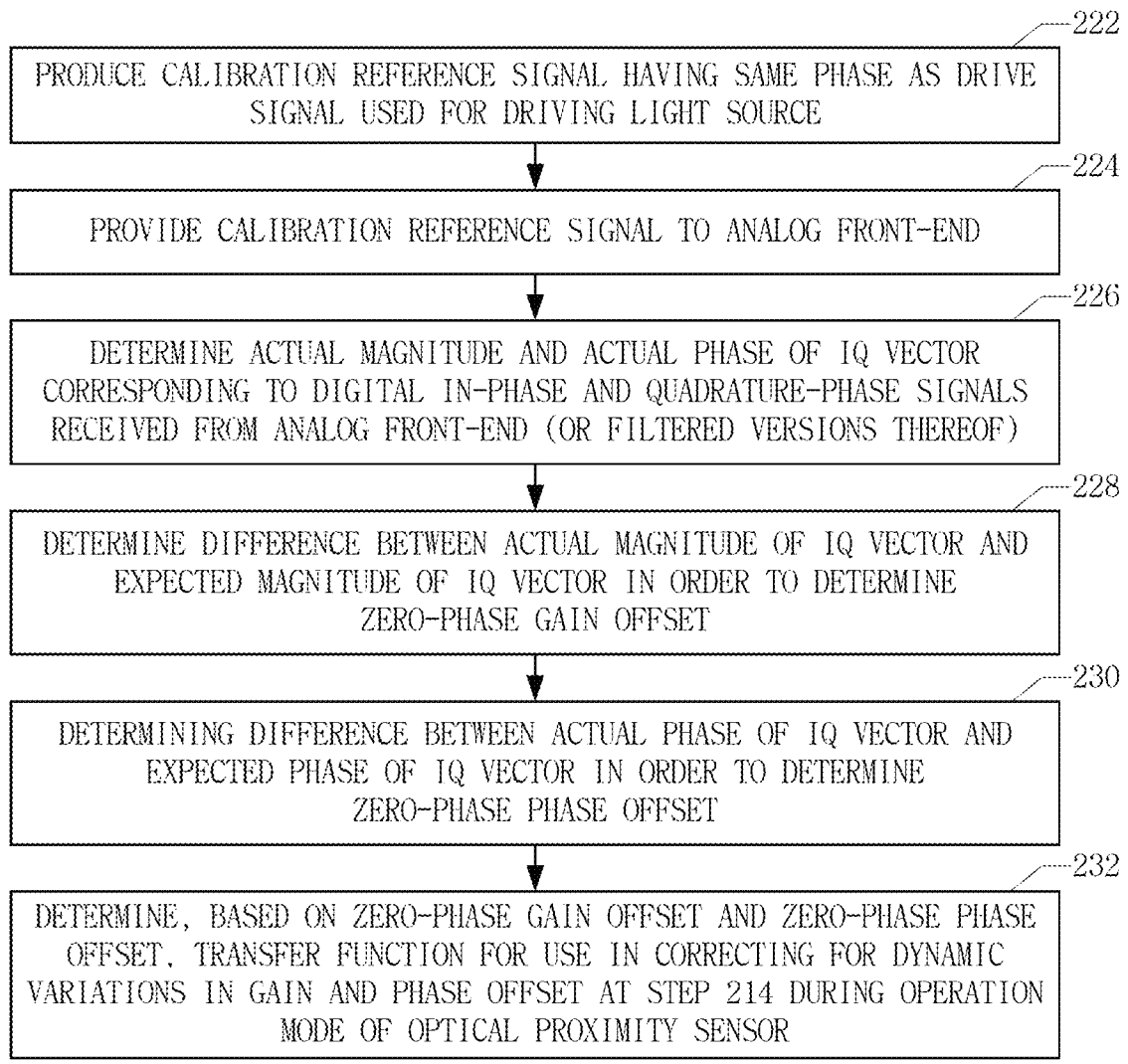
FIG. 2B is a high level flow diagram that is used to describe a method for use by an optical proximity detector, such as the one introduced in FIG. 1, during a dynamic gain and phase offset calibration mode.
Figure 2C:
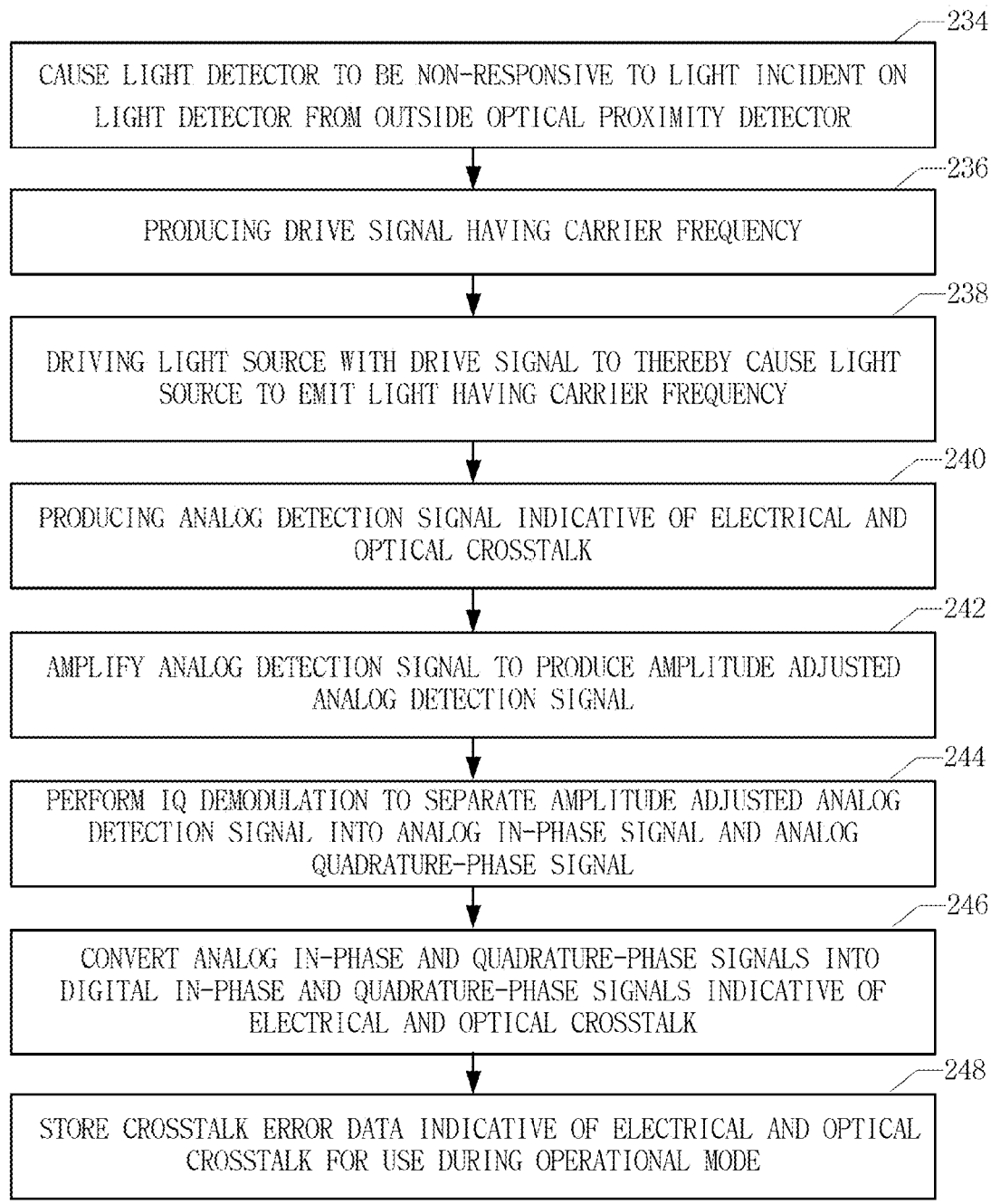
FIG. 2C is a high level flow diagram that is used to describe a method for use by an optical proximity detector, such as the one introduced in FIG. 1, during a crosstalk calibration mode.
Figure 2D:
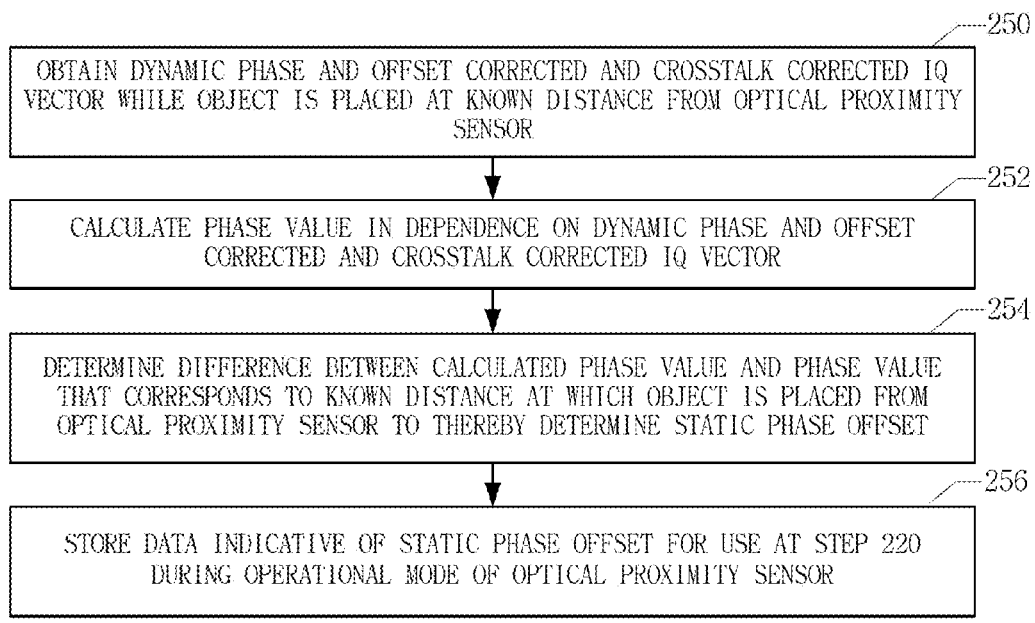
FIG. 2D is a high level flow diagram that is used to describe a method for use by an optical proximity detector, such as the one introduced in FIG. 1, during a static phase offset calibration mode.

The high level flow diagram of FIGS. 2A, 2B, 2C and 2D will now be used to describe methods that are for use with an optical proximity detector, such as the optical proximity detector 102 described with reference to FIG. 1. The steps described with reference to FIG. 2A are intended to be performed during an operational mode of the optical proximity detector. The steps described with reference to FIG. 2B are intended to be performed during a dynamic gain and phase offset calibration mode or procedure of the optical proximity detector. The steps described with reference to FIG. 2C are intended to be performed during a crosstalk calibration mode or procedure. The steps described with reference to FIG. 2D are intended to be performed during a static phase offset calibration procedure.

As will be appreciated from the following discussion, and as mentioned above, at least one instance of the calibration procedures described with reference to FIGS. 2B, 2C and 2D should be performed before the first instance of the operational procedure or mode described with reference to FIG. 2A, so that the optical proximity detector can determine (during the calibration procedure) the appropriate values, vectors, transfer functions and/or the like, to use during the operational mode.

Referring to FIG. 2A, a drive signal having a carrier frequency is produced, as indicated at step 202. Step 202 can be performed, e.g., by the driver 110 described above with reference to FIG. 1. As indicated at step 204, a light source (e.g., 106 in FIG. 1) is driven with the drive signal to thereby cause the light source to emit light having the carrier frequency. At step 206, an analog light detection signal is produced, which is indicative of a magnitude and a phase of a portion of the light emitted by the light source that reflects off an object and is incident on a light detector (e.g., 106 in FIG. 1). At step 208, the analog light detection signal is amplified using analog amplification circuitry (e.g., 132 in FIG. 1) to thereby produce an amplitude adjusted analog light detection signal. At step 210, IQ demodulation is performed to separate the amplitude adjusted analog light detection signal into an analog in-phase signal and an analog quadrature-phase signal. Step 210 can be performed, e.g., by the IQ demodulator 140 described above with reference to FIG. 1. At step 212, the analog in-phase and quadrature-phase signals are converted into digital in-phase and quadrature-phase signals. Step 212 can be performed, e.g., by the ADCs 146*i*, 146*q* described above with reference to FIG. 1. More generally, steps 202-212 can be performed by an analog front-end, such as, but not limited to, the analog front-end 108 described above with reference to FIG. 1.

As explained above in the discussion of FIG. 1, rather than performing IQ demodulation in the analog domain, IQ demodulation can alternatively be performed in the digital domain by the digital back-end 112. Accordingly, more generally, between steps 208 and 214 in FIG. 2A there is a producing of digital in-phase and quadrature-phase signals in dependence on the amplitude adjusted analog light detection signal.

At step 214, a correction is performed for dynamic variations in gain and phase offset caused by a portion of the analog-front end to thereby produce dynamic gain and phase offset corrected digital in-phase and quadrature-phase signals. At step 216, a correction for electrical crosstalk and/or optical crosstalk is performed to thereby produce crosstalk corrected digital in-phase and quadrature-phase signals. At step 218, a phase value and a magnitude value is determined in dependence on the crosstalk corrected digital in-phase and quadrature-phase signals. At step 220, a correction for a static phase offset associated with the analog front-end is performed to thereby produce a phase value indicative of a distance to the object. Steps 214-220 can be performed by a digital back-end, such as, but not limited to, the digital back-end 112 described above with reference to FIG. 1. More specifically, steps 214, 216, 218 and 220 can be performed, respectively, by the dynamic gain and phase offset corrector 153, the crosstalk corrector 154, the phase and magnitude calculator 156 and the static phase offset corrector 158.

Referring back to step 214, the portion of the analog front-end, for which dynamic variations in gain and phase offset are corrected, can include amplification circuitry (e.g., 132 in FIG. 1) used to perform the amplifying at step 208. As explained above, such dynamic variations in gain and phase offset can be due to dynamic variations in the temperature and/or operating voltage associated with the amplification circuitry. Additionally, the portion of the analog front-end, for which dynamic variations in gain and phase offset are corrected for at step 214, can include the light source and/or the light detector (e.g., 104 and/or 106 in FIG. 1).

The amplification circuitry, used to perform the amplifying at step 208, has a transfer function that includes a nominal portion corresponding to a nominal response of the amplification circuitry and a dynamic portion corresponding to a dynamic gain offset and a dynamic phase offset of the amplification circuitry. In accordance with an embodiment, the correcting for dynamic variations in gain and phase offset that is performed at step 214 is performed using a DSP and/or digital circuitry that applies a transfer function that is substantially equal to an inverse of the dynamic portion of the transfer function of the analog amplification circuitry. If the aforementioned transfer function (which includes the nominal portion and the dynamic portion) also includes the response of the light source and/or light detector, then the aforementioned inverse transfer function used at step 214 can also correct for dynamic variations in gain and phase offset caused by the light source and/or light detector.

In accordance with an embodiment, steps 202-212 are performed by an analog front-end of an optical proximity detector, and steps 214-220 are performed by a digital back-end of the optical proximity detector. As mentioned above, steps 202-220, described with reference to FIG. 2A, are performed during an operational mode of the optical proximity detector. FIGS. 2B, 2C and 2D will now be used to describe steps that can be performed during various calibration modes of the optical proximity detector.

FIG. 2B is a high level flow diagram that is used to describe a method for use by an optical proximity detector, such as the one introduced in FIG. 1, during a dynamic gain and phase offset calibration mode. Referring to FIG. 2B, at step 222 a calibration reference signal is produced that has a same phase as the drive signal used for driving the light source. Step 222 can be performed, e.g., using the calibration reference signal generator 107 described above with reference to FIG. 1. At step 224, the calibration reference signal is provided to the analog front-end, e.g., using the switch Sw in FIG. 1. At step 226, an actual magnitude and an actual phase of an IQ vector corresponding to digital in-phase and quadrature-phase signals received from the analog front-end, or filtered versions thereof are determined. At step 228, a difference between the actual magnitude of the IQ vector and an expected magnitude of the IQ vector is determined in order to determine a zero-phase gain offset. At step 230, a difference between the actual phase of the IQ vector and an expected phase of the IQ vector is determined in order to determine a zero-phase phase offset. At step 232, based on the zero-phase gain offset and the zero-phase phase offset, there is a determination of a transfer function that is for use in correcting for dynamic variations in gain and phase offset at step 214 during the operational mode of the optical proximity detector. Step 232 can also include storing data indicative of the determined transfer function. Steps 224-232 can be performed. e.g., by the dynamic gain and phase offset corrector 153 in FIG. 1, or a DSP, or more generally a processor. Such a DSP, or more generally processor, may or may not be the same one that is used to implement the dynamic gain and phase offset corrector 153 in FIG. 1.

FIG. 2C is a high level flow diagram that is used to describe a method for use by an optical proximity detector, such as the one introduced in FIG. 1, during a crosstalk calibration mode to determining values or vectors for use at step 216 (during the operational mode) to correct for electrical and/or optical crosstalk. Referring to FIG. 2C, at step 234, the light detector (e.g., 106 in FIG. 1) is caused to be non-responsive to light incident on the light detector 106 from outside the optical proximity detector 102. Exemplary details of how to perform step 234 were described above, and thus, need not be repeated. At step 236 and 238, respectively, the drive signal having the carrier frequency is produced (e.g., by the driver 110 in FIG. 1), and the light source is driven with the drive signal to thereby cause the light source to emit light having the carrier frequency. At step 240, an analog detection signal indicative of electrical and optical crosstalk is produced. At step 242, the analog detection signal is amplified using amplification circuitry (e.g., 132 in FIG. 1) to thereby produce an amplitude adjusted analog detection signal. At step 244, IQ demodulation is performed to separate the amplitude adjusted analog detection signal into an analog in-phase signal and an analog quadrature-phase signal. At step 246, the analog in-phase and quadrature-phase signals are converted into digital in-phase and quadrature-phase signals indicative of electrical and optical crosstalk. At step 248, crosstalk error data indicative of electrical and optical crosstalk is saved (e.g. in registers 160 or memory 162 in FIG. 1) for use during the operational mode. Preferably the crosstalk error data is saved in non-volatile memory.

FIG. 2D is a high level flow diagram that is used to describe a method for use by an optical proximity detector, such as the one introduced in FIG. 1, during a static phase offset calibration mode. Referring to FIG. 2D, while an object is placed at a known distance from optical proximity detector (e.g., 102), a dynamic phase and offset corrected and crosstalk corrected IQ vector is obtained, as indicated at step 250. This step can be performed by essentially performing steps 202-216 described above with reference to FIG. 2A, while an object is placed at a known distance from the optical proximity detector. At step 252, a phase value is calculated in dependence on the dynamic phase and offset corrected and crosstalk corrected IQ vector. This step can be performed by essentially performing step 218 described above with reference to FIG. 2A. At step 254, a difference is determined between the phase value calculated at step 252 and a phase value that corresponds to the known distance at which the object is placed from the optical proximity detector, to thereby determine the static phase offset. At step 256, data indicative of the static phase offset is saved (e.g., in a register or memory) for use at step 220 during the operational mode.

Alternative Embodiments

Figure 3A:
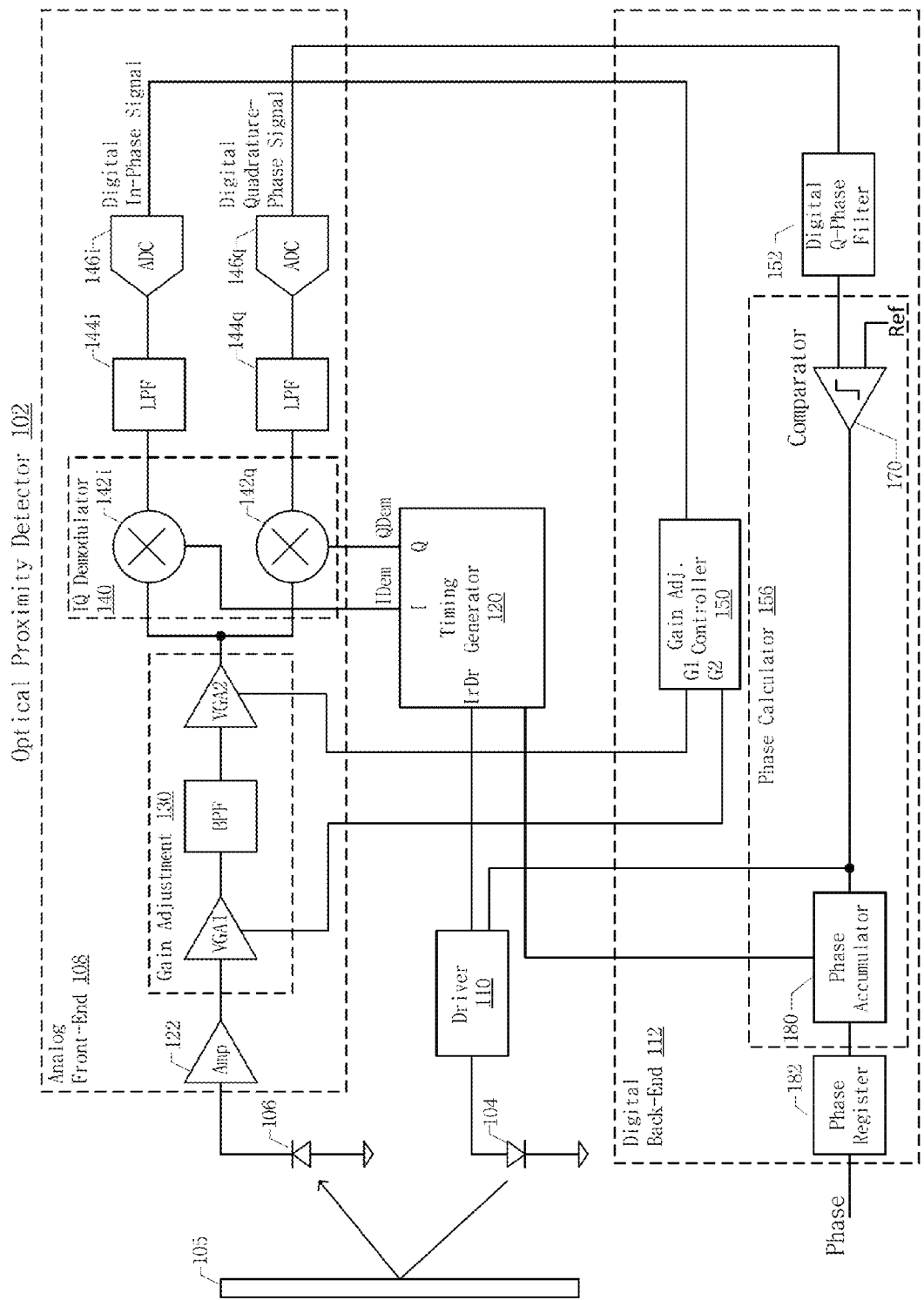
FIGS. 3A and 3B are block diagrams that are used to describe a specific implementation of the digital back-end, introduced in FIG. 1, according to an embodiment.
Figure 3B:
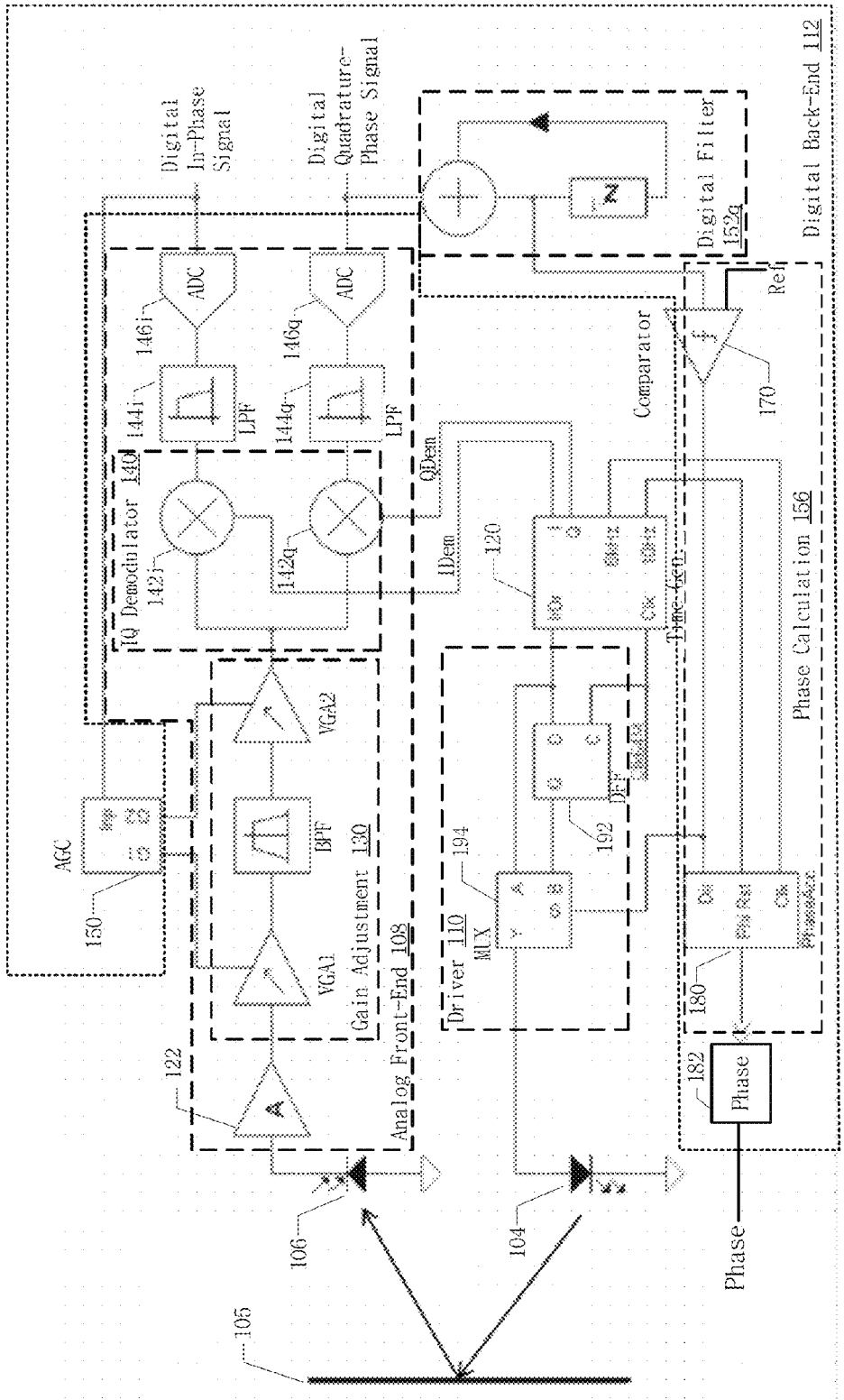

FIGS. 3A and 3B will now be used to describe an implementation of the back-end 112, according to another embodiment. Referring to FIG. 3A, the gain adjustment controller 150 is shown as receiving the digital-in-phase signal, but not the digital quadrature-phase signal. The digital quadrature-phase signal is shown as being filtered by the digital filter 152, and then provided to a comparator 170. The output of the comparator 170 is provided to a phase accumulator 180. Additional details of the embodiment of FIG. 3A, according to a specific implementation, are shown and described with reference to FIG. 3B. While not specifically shown in FIGS. 3A and 3B, the back-end 112 of these embodiments can also include the dynamic gain and phase offset corrector 153, the crosstalk corrector 154, the phase and magnitude calculator 156 and the static phase offset corrector 158.

As will be described in additional detail below, the optical proximity detector 102 described shown in FIG. 3B includes two feedback loops, including: a first feedback loop that is used to set the magnitude of the in-phase signal to a first predetermined level; and a second feedback loop that is used to set the magnitude of the quadrature-phase signal to a second predetermined level. For reasons that will be clear from the description below, the first feedback loop can also be referred to as a gain adjustment feedback loop, and the second feedback loop can also be referred to as a phase adjustment feedback loop.

The gain adjustment feedback loop, which includes the gain adjustment circuit 130, the mixer 142$i$, the analog LPF 144$i$, the ADC 146$i$ and the Gain adjustment controller 150, is used to set the digital in-phase signal to a predetermined desired value. More specifically, the digital in-phase signal (output by the ADC 146$i$) is provided to the Gain adjustment controller 150, and the Gain adjustment controller 150 adjusts the gain of one or more VGAs to achieve a predetermined digital in-phase signal magnitude. In this embodiment, because the phase adjustment feedback loop (described below) is being used to set a magnitude of the quadrature-phase signal to zero, it can be assumed that the quadrature-phase signal has a zero magnitude, which enables simplification of the gain adjustment feedback loop.

The phase adjustment feedback loop, which includes the driver 110, the light source 104, the light detector 106, the optional fixed gain amplifier 122 (if present), the gain adjustment circuit 130, the mixer 142$q$, the analog LPF 144$q$, the ADC 146$q$, the digital filter 152$q$ and the comparator 170, is used to set the magnitude of the digital quadrature-phase signal to zero, which as mentioned above, corresponds to the output of the sigma delta ADC 146$q$ having its midrange value (e.g., a decimal value of 512, which is a binary value of 1000000000, assuming that the sigma delta ADC 146$q$ is a 10-bit sigma delta ADC). The operation of the phase adjustment feedback loop will now be described. The driver circuit 110 drives the light source 104 with a drive signal, which for the sake of this description is presumed to be a 5 MHz square wave signal, as mentioned above. The light source 104 emits an infrared light signal having a 5 MHz carrier frequency, in response to being driven by the drive signal. The infrared light reflects off of the object 105, and a portion of the reflected infrared light signal is incident on the light detector 106. The light detection signal, which is produced by the light detector 106, has both an amplitude and a phase. The amplitude of the detect signal is amplified by the optional amplifier 122 and by the gain adjustment circuit 130. The IQ demodulator 140, as mentioned above, separates the amplitude adjusted light detection signal into its in-phase and quadrature-phase components.

The digital quadrature-phase signal is provided to the digital filter 152$q$, which can be implemented as an integrate-and-dump circuit, in which case it can also be referred to as a decimator, an integrate-and-dump decimator, or an integrate-and-dump filter. The digital filter 152$q$ integrates the digital quadrature-phase signal for a period of time and then outputs (a.k.a. dumps) the result, at which point it is reset and repeats the integration and dump functions for another period of time, and so on. For the sake of this description, it is assumed that the digital filter 152$q$ has a frequency of 16 kHz, meaning it produces an output 16,000 times per second, and more specifically, every 0.0625 msec. The output of the digital filter 152 is used to set the magnitude of the digital quadrature-phase signal to zero, which as mentioned above, corresponds to the output of the sigma delta ADC 146$q$ having its midrange value. The comparator 170 is used to compare the output of the digital filter 152 to a reference value, which in this case, is the mid-range value of the sigma-delta ADC 146q. The output of the comparator is high (i.e., a binary 1) when the output of the digital filter 152 is greater than the reference value. The output of the comparator is low (i.e., a binary 0) when the output of the digital filter 152 is less than the reference value. The output of the comparator will toggle between high and low when the output of the digital filter 152 is equal to the reference value. The output of the comparator 170 is provided to both the driver circuit 110 and a phase accumulator 180.

In accordance with an embodiment, at any given time, the drive signal output by the driver circuit 110 is either an in-phase drive signal or an offset-phase drive signal. The phase of the offset-phase drive signal can be dependent on the phase resolution achievable using a clock (Clk) signal and the drive timing signal (also referred to as the IrDr timing signal), both of which are produced by the timing generator 120. For example, if the clock signal is 64 MHz, and the drive timing signal is 5 MHz (in which case, the carrier frequency of the emitted infrared light will be 5 MHz), then the phase resolution will be approximately 30 degrees. This is because a 5 MHz carrier frequency corresponds to a 200 ns period, which in turn corresponds to 360 degrees. The clock period for a 64 MHz clock is 15.6 ns, which is 7.8% of the 200 ns period (of the 5 MHz carrier frequency), which in turn is 28.08 degrees (out of 360 degrees), which can be considered approximately 30 degrees.

For this example, the offset-phase drive signal will be presumed to lead the in-phase drive signal by 30 degrees, but can alternatively lag the in-phase drive signal by 30 degrees, depending on implementation. Using time averaging, other effective drive phases (between 0 degrees and 30 degrees) can be synthesized. For example, an alternating sequence of N in-phase drive pulses and N drive pulses that lead the in-phase pulses by 30 degrees (wherein N is an integer that is greater than or equal to 1) produces an effective drive phase of 15 degrees. For another example, two sequences of N in-phase drive pulses, followed by one sequence of N drive pulses that lead the in-phase pulses by 30 degrees, results in an effective drive phase of 10 degrees. The phase adjustment feedback loop adjusts the effective phase of the drive signal (i.e., the effective drive phase) to cause the quadrature-phase signal to have a zero magnitude. This means that the LPF 144q and the ADC 146q can be designed to operate on relatively low amplitude error signals, which advantageously relaxes the linearity requirements of these components compared to if these components had to operate on signals having larger amplitude swings.

The driver circuit 110 produces a drive signal in dependence on a drive timing signal (also referred to as the IrDr timing signal) produced by the timing generator 120 and an output of the comparator 170. The driver circuit 110, in accordance with the embodiment shown in FIG. 3B, includes a D-flip-flop (DFF) 192 and a multiplexer (MUX) 194. The clock input of the DFF 192 is shown as receiving the clock (Clk) signal from the timing generator 120, which for the purpose of this description is assumed to be a 64 MHz clock signal. The D-input of the DFF 192 receives the drive timing signal, which for the purpose of this description is assumed to be a 5 MHz square wave signal output by the timing generator 120. This drive timing signal is the in-phase drive signal. The signal output at the Q output of the DFF 192 is the offset-phase drive signal, which for the purpose of this description, is assumed to lead the in-phase drive signal by 30 degrees. The in-phase drive signal and the offset-phase drive signal are both provided to the MUX 194. The output of the comparator 170 is used to select among the two inputs of the MUX 194, i.e., to select whether it is the in-phase drive signal or the offset-phase drive signal that is output by the MUX 194 and used as the drive signal to drive the light source 104.

As mentioned above, the output of the comparator 170 is also provided to the phase accumulator 180. In accordance with an embodiment, the phase accumulator 180 is implemented as a binary up-down counter. The phase accumulator 180 is shown as also receiving an 8 kHz clock signal at its clock (Clk) input, and a 10 Hz signal at its reset (Rst) input. The phase accumulator 180 operates similar to an integrate-and-dump circuit in that it integrates the output of the comparator 170 for a period of time and then outputs the result to a register 182, at which point it is reset and repeats this function for another period of time, and so on. For the sake of this description, it is assumed that the phase accumulator 180 has a frequency of 10 Hz, meaning it produces an output 10 times per second, and more specifically, every 100 msec. The output of the phase accumulator 180, which is stored in the register 182, is indicative of the phase-offset that caused quadrature-phase signal to have a zero magnitude, which is indicative of the actual distance between the object 105 and the optical proximity detector 102. For example, the phase-offset can be converted to a time delay (because for any carrier frequency there is a corresponding relationship between phase-offset and time delay). The time delay can be converted to a roundtrip distance by multiplying the time delay by the well-known speed of light. The roundtrip distance can be converted to a one-way distance, which is the distance between the optical proximity detector 102 and the object 105, by dividing the roundtrip distance by two. More specifically, the distance (d) between the optical proximity detector 102 and the object 105 can be determined using the equation: d=(c*t)/2, where c is the speed of light and t is the time delay.

In accordance with an embodiment, when output of the comparator is high, the Q-component is positive, and when the output of the comparator is low, the Q-component magnitude is negative. The phase adjustment feedback loop (based on the sign of the Q-component) dithers the phase of the drive signal to minimize the magnitude of the Q-component (ideally driving it to zero) and therefore always aligns the effective phase to the reference phase. The phase accumulator 180, implemented as a binary up/down counter, can be used to perform real time (0° or 30°) averaging of phase steps. For a 10 Hz data rate 800 samples are averaged. This count is directly proportional to the phase shift between the reference and the effective phase synthesized by dithering the drive signal phase.

Any change in phase (due to movement of the target 105) will cause a change of duty cycle of the drive signal, since the Q-component is always driven to zero by the phase adjustment feedback loop. Change in the binary up/down counter average is linearly proportional to the change in phase. Theoretical phase resolution is 30/1600, i.e. ~0.02°/count for 10 Hz sample rate. The phase quantization noise (assuming uniform distribution) is higher 30/√800, i.e. ~0.1° for 10 Hz sample rate (compared to phase resolution). Quantization noise can be reduced by reducing the phase quantization step size. There are many practical ways to reduce phase quantization step size. For example, the simplest is to increase the clock rate or use semi-synchronous logic, i.e., both edges of the clock in digital logic.

Figure 4:
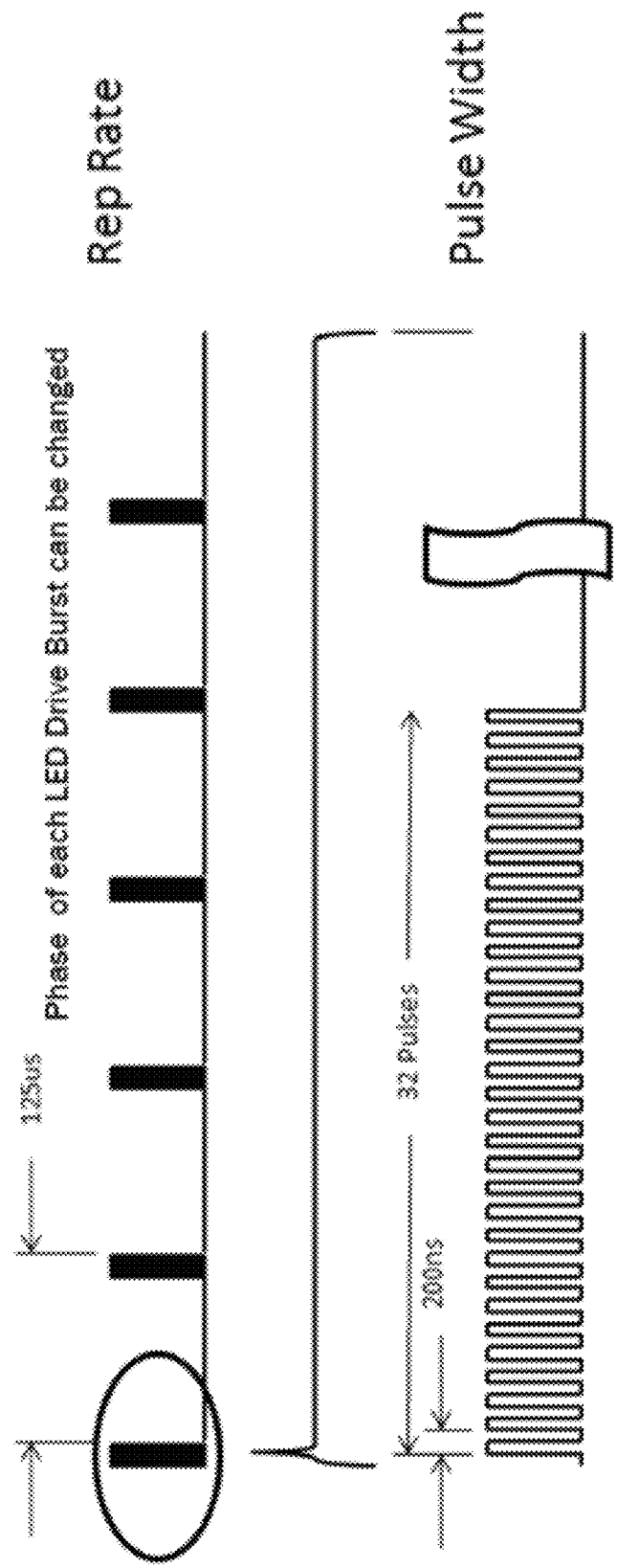
FIG. 4 illustrates an exemplary repetition rate and an exemplary pulse width of the drive signal produced by the driver introduced in FIG. 1.

FIG. 4 illustrates an exemplary repetition rate and an exemplary pulse width of the drive signal produced by the driver 110.

Systems

Figure 5:
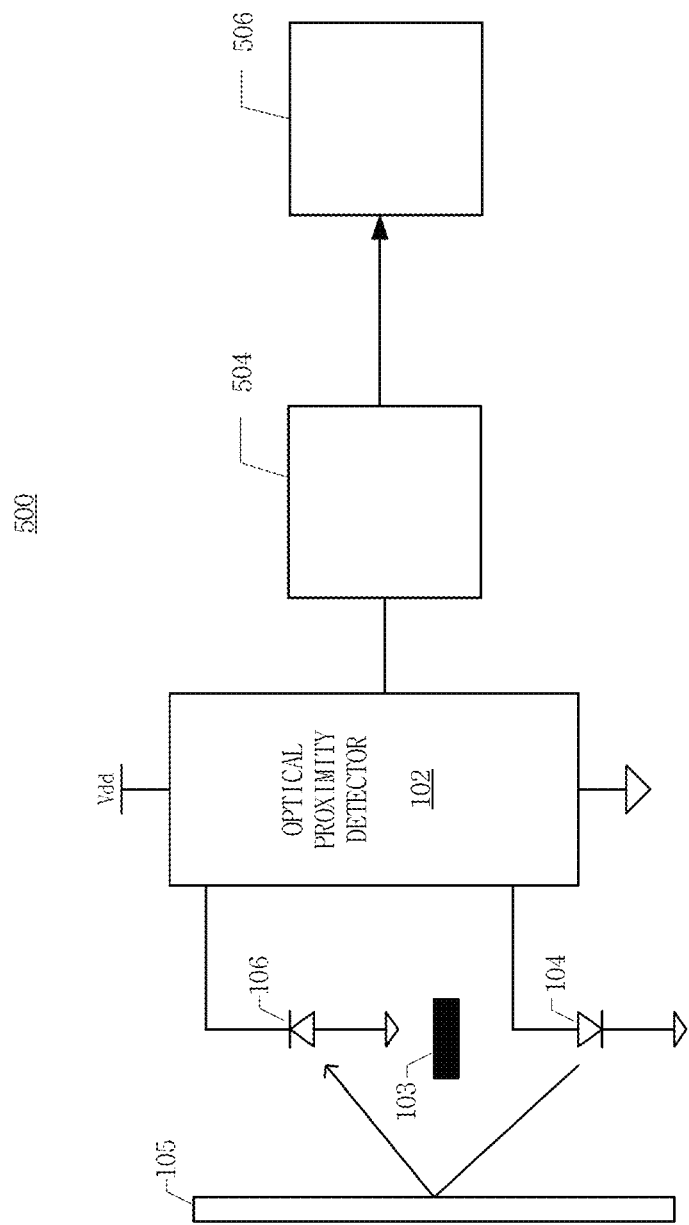
FIG. 5 illustrates a system, according to an embodiment, which includes the optical proximity detector introduced in FIG. 1.

Optical proximity detectors of embodiments of the present invention can be used in various systems, including, but not limited to, cell-phones and handheld-devices. Referring to the system 500 of FIG. 5, for example, the optical proximity detector 102 can be used to control whether a subsystem 506 (e.g., a touch-screen, display, backlight, virtual scroll wheel, virtual keypad, navigation pad, a camera, another sensor, a central processing unit (CPU), a mechanical actuator, etc.) is enabled or disabled. For example, the optical proximity detector can detect when an object, such as a person's finger, is approaching, and based on the detection either enable (or disable) a subsystem 506. More specifically, an output of the proximity detector 102 can be provided to a comparator or processor 504 which can, e.g., compare the output of the proximity detector to a threshold, to determine whether the object is within a range where the subsystem 506 should be enabled (or disabled, depending on what is desired). Multiple thresholds (e.g., stored digital values) can be used, and more than one possible response can occur based on the detected proximity of an object. For example, a first response can occur if an object is within a first proximity range, and a second response can occur if the object is within a second proximity range. Exemplary responses can include starting various system and/or subsystem operations.

While the light source 104 and the light detector 106 are shown as being external the optical proximity detector, one or both of the light source 104 and the light detector 106 can be considered part of the optical proximity detector 102, and more specifically part of the analog front-end of the optical proximity detector, depending upon implementation.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. An optical proximity detector, comprising:
   a driver that produces a drive signal, having a carrier frequency, for use in driving a light source to thereby cause the light source to emit light having the carrier frequency;
   a light detector that produces a light detection signal indicative of a magnitude and a phase of a portion of the light emitted by the light source that reflects off an object and is incident on the light detector,
   an analog front-end including
      amplification circuitry that receives the light detection signal and outputs an amplitude adjusted light detection signal;
      one or more analog-to-digital converters (ADCs) that receive the amplitude adjusted light detection signal, or in-phase and quadrature-phase signals produced therefrom, and
         output a digital light detection signal, or digital in-phase and quadrature-phase signals; and
   a digital back-end including a dynamic gain and phase offset corrector that during an operational mode of the optical proximity detector
      receives the digital light detection signal from the analog front end and produces digital in-phase and quadrature-phase signal therefrom, or receives the digital in-phase and quadrature-phase signals from the analog front end,
      corrects for dynamic variations in gain and phase offset caused by a portion of the analog front-end, and
      outputs dynamic gain and phase offset corrected digital in-phase and quadrature-phase signals.

2. The optical proximity detector of claim 1, further comprising:
   a calibration reference signal generator that produces a calibration reference signal having a same phase as the drive signal produced by the driver and having a magnitude within a dynamic range of the analog front-end;
   wherein during a calibration mode of the optical proximity detector
      the calibration reference signal, produced by the calibration reference signal generator, is provided to the analog front-end; and
      the digital back-end
         determines an actual magnitude and an actual phase of an IQ vector corresponding to the digital in-phase and quadrature-phase signals;
         determines a difference between the actual magnitude of the IQ vector and an expected magnitude of the IQ vector in order to determine a zero-phase gain offset;
         determines a difference between the actual phase of the IQ vector and an expected phase of the IQ vector in order to determine a zero-phase phase offset; and
         determines, based on the zero-phase gain offset and the zero-phase phase offset, a transfer function for use by the dynamic gain and phase offset corrector during the operational mode of the optical proximity detector.

3. The optical proximity detector of claim 1, wherein:
   the portion of the analog front-end, for which the dynamic gain and phase offset corrector corrects for dynamic variations in gain and phase offset, includes the amplification circuitry;
   the amplification circuitry of the analog front-end includes a fixed gain amplifier and one or more variable gain amplifiers downstream of the fixed gain amplifier; and
   the dynamic variations in gain and phase offset caused by the amplification circuitry are due to dynamic variations in at least one of temperature or operating voltage associated with the amplification circuitry.

4. The optical proximity detector of claim 3, wherein the dynamic gain and phase offset corrector also corrects for dynamic variations in gain and phase offset of at least one of the light source or the light detector.

5. The optical proximity detector of claim 1, wherein:
   the portion of the analog front-end, for which the dynamic gain and phase offset corrector corrects for dynamic variations in gain and phase offset, has a transfer function that includes a nominal portion corresponding to a nominal response of the portion of the analog front-end and a dynamic portion corresponding to a dynamic gain offset and a dynamic phase offset of the portion of the analog front-end; and
   the dynamic gain and phase offset corrector has a transfer function that is substantially equal to an inverse of the dynamic portion of the transfer function of the portion of the analog front-end.

6. The optical proximity detector of claim 1, wherein the digital back-end also includes:
   a cross-talk corrector that
      receives the dynamic gain and phase offset corrected digital in-phase and quadrature-phase signals from the dynamic gain and phase offset corrector,
      corrects for at least one of electrical crosstalk or optical crosstalk, and outputs crosstalk corrected digital in-phase and quadrature-phase signals.

7. The optical proximity detector of claim 6, wherein the digital back-end also includes:
a phase and magnitude calculator that determines a phase value and a magnitude value in dependence on the crosstalk corrected digital in-phase and quadrature-phase signals.

8. The optical proximity detector of claim 7, wherein the digital back-end also includes:
a static phase offset corrector that
receives the phase value determined by the phase and magnitude calculator,
corrects for a static phase offset associated with the analog front-end, and
outputs a corrected phase value indicative of a distance between the optical proximity detector and an object off of which light, emitted by a light source driven by the driver, reflected and is incident on the light detector.

9. The optical proximity detector of claim 8, wherein the static phase offset corrector also corrects for a static offset associated with at least one of the light source or the light detector.

10. The optical proximity detector of claim 1, wherein the digital back-end also includes a gain adjustment controller that produces a gain adjustment signal that is used to adjust a gain of one or more variable gain amplifiers of the amplification circuitry of the analog front-end.

11. A method for use by an optical proximity detector including an analog front-end and a digital back-end, the method comprising:
(a) producing a drive signal having a carrier frequency;
(b) driving a light source with the drive signal to thereby cause the light source to emit light having the carrier frequency;
(c) producing an analog light detection signal indicative of a magnitude and a phase of a portion of the light emitted by the light source that reflects off an object and is incident on a light detector;
(d) amplifying the analog light detection signal using amplification circuitry of the analog front-end to thereby produce an amplitude adjusted analog light detection signal;
(e) producing, in dependence on the amplitude adjusted analog light detection signal, digital in-phase and quadrature-phase signals; and
(f) correcting for dynamic variations in gain and phase offset caused by a portion of the analog-front end to thereby produce dynamic gain and phase offset corrected digital in-phase and quadrature-phase signals.

12. The method of claim 11, wherein steps (a) through (f) are performed during an operational mode of the optical proximity detector, and further comprising, during a calibration mode of the optical proximity detector:
producing a calibration reference signal having a same phase as the drive signal used for driving the light source;
providing the calibration reference signal to the analog front-end;
determining an actual magnitude and an actual phase of an IQ vector corresponding to digital in-phase and quadrature-phase signals received from the analog front-end, or filtered versions thereof;
determining a difference between the actual magnitude of the IQ vector and an expected magnitude of the IQ vector in order to determine a zero-phase gain offset;
determining a difference between the actual phase of the IQ vector and an expected phase of the IQ vector in order to determine a zero-phase phase offset; and
determining, based on the zero-phase gain offset and the zero-phase phase offset, a transfer function for use in correcting for dynamic variations in gain and phase offset at step (f) during the operational mode of the optical proximity detector.

13. The method of claim 11, wherein steps (a) through (f) are performed during an operational mode of the optical proximity detector, and further comprising, during a calibration mode of the optical proximity detector:
causing the light detector to be non-responsive to light incident on the light detector from outside the optical proximity detector,
producing the drive signal having the carrier frequency,
driving the light source with the drive signal to thereby cause the light source to emit light having the carrier frequency,
producing an analog detection signal indicative of electrical and optical crosstalk;
amplifying the analog detection signal using the amplification circuitry of the analog front-end to thereby produce an amplitude adjusted analog detection signal;
producing, in dependence on the amplitude adjusted analog detection signal, digital in-phase and quadrature-phase signals; and
storing crosstalk error data indicative of electrical and optical crosstalk for use during the operational mode.

14. The method of claim 11, wherein:
the portion of the analog front-end, for which dynamic variations in gain and phase offset are corrected for at step (f), includes amplification circuitry used to perform the amplifying at step (d); and
the dynamic variations in gain and phase offset caused by the amplification circuitry are due to dynamic variations in at least one of temperature or operating voltage associated with the amplification circuitry.

15. The method of claim 14, wherein the portion of the analog front-end, for which dynamic variations in gain and phase offset are corrected for at step (f), also includes at least one of the light source or the light detector.

16. The method of claim 14, wherein:
the amplification circuitry, used to perform the amplifying at step (d), has a transfer function that includes a nominal portion corresponding to a nominal response of the amplification circuitry and a dynamic portion corresponding to a dynamic gain offset and a dynamic phase offset of the amplification circuitry; and
at step (f) the correcting for dynamic variations in gain and phase offset is performed using digital circuitry having a transfer function that is substantially equal to an inverse of the dynamic portion of the transfer function of the amplification circuitry.

17. The method of claim 11, further comprising:
(g) correcting for at least one of electrical crosstalk and optical crosstalk to thereby produce crosstalk corrected digital in-phase and quadrature-phase signals.

18. The method of claim 17, further comprising:
(h) determining a phase value and a magnitude value in dependence on the crosstalk corrected digital in-phase and quadrature-phase signals.

19. The method of claim 18, further comprising:
(i) correcting for a static phase offset associated with the analog front-end to thereby produce a phase value indicative of a distance to the object.

20. The method of claim 18, wherein steps (a)-(d) are performed by the analog front-end of the optical proximity detector, steps (f)-(i) are performed by the digital back-end of the optical proximity detector, and step (e) is performed by either the analog front-end or the digital back-end of the optical proximity detector.

21. A system, comprising:
- a driver that produces a drive signal, having a carrier frequency, for use in driving a light source to thereby cause the light source to emit light having the carrier frequency;
- a light detector that produces a light detection signal indicative of a magnitude and a phase of a portion of the light emitted by the light source that reflects off an object and is incident on the light detector.
- an analog front-end that receives the light detection signal and outputs a digital light detection signal or digital in-phase and quadrature-phase signals produced therefrom; and
- a digital back-end that receives the digital light detection signal from the analog front end and produces digital in-phase and quadrature-phase signals therefrom, or receives the digital in-phase and quadrature-phase signals from the analog front end, the digital back end including
- a dynamic gain and phase offset corrector that receives that digital in-phase and quadrature-phase signals and outputs dynamic gain and phase offset corrected digital in-phase and quadrature-phase signals;
- a cross-talk corrector that receives the dynamic gain and phase offset corrected digital in-phase and quadrature-phase signals and outputs crosstalk corrected digital in-phase and quadrature-phase signals; and
- a phase and magnitude calculator that determines a phase value and a magnitude value in dependence on the crosstalk corrected digital in-phase and quadrature-phase signals; and
- a static phase offset corrector that receives the phase value determined by the phase and magnitude calculator, corrects for a static phase offset associated with the analog front-end, and outputs a corrected phase value indicative of a distance between the optical proximity detector and an object off of which light, emitted by the light source driven by the driver, reflected and is incident on the light detector.

22. The system of claim 21, further comprising:
- a subsystem capable of being enabled and disabled; and
- a comparator or processor that receives corrected phase value from the static phase offset corrector of the digital back-end and selectively enables or disables the subsystem in dependence thereon.

23. The system of claim 22, wherein the subsystem is selected from the group consisting of:
- a touch-screen,
- a display,
- a backlight,
- a virtual scroll wheel,
- a virtual keypad,
- a navigation pad,
- a camera,
- a sensor,
- a central processing unit (CPU), or
- a mechanical actuator.

\* \* \* \* \*